United States Patent [19]

Martin et al.

[11] Patent Number: 4,616,896

[45] Date of Patent: Oct. 14, 1986

[54] CONNECTING TERMINAL FOR PRINTED CIRCUIT BOARD

[75] Inventors: Gabriel R. J. Martin, Houilles; Jean-Marie J. G. Riquier, Villepreux, both of France

[73] Assignee: La Telemecanique Electrique, France

[21] Appl. No.: 722,431

[22] Filed: Apr. 15, 1985

Related U.S. Application Data

[63] Continuation of Ser. No. 472,507, Mar. 7, 1983, abandoned.

[30] Foreign Application Priority Data

Mar. 5, 1982 [FR] France ............................... 82 03678

[51] Int. Cl.$^{4}$ ............................................. H05K 1/00

[52] U.S. Cl. ........................... 339/17 C; 339/275 B; 339/263 R

[58] Field of Search ................ 339/17 C, 17 LC, 263, 339/246, 275 B, 275 R, 143

[56] References Cited

U.S. PATENT DOCUMENTS 3,484,696 12/1969 Taylor et al. .................. 339/17 LC
3,523,268 8/1970 Foster ............................ 339/263 R
3,624,588 11/1971 Tarmer ............................... 339/246
3,670,207 6/1972 Seabury .......................... 339/17 LC
3,760,330 9/1973 Bennett et al. ...................... 339/246
3,818,278 6/1974 Adler ................................. 339/143
3,846,743 11/1974 Garver ........................... 339/275 B
4,099,826 7/1978 Mazzeo et al. ................. 339/263 R

FOREIGN PATENT DOCUMENTS 2700232 7/1978 Fed. Rep. of Germany ... 339/263 R
1493718 7/1967 France .......................... 339/17 LC

*Primary Examiner*—Gil Weidenfeld
*Assistant Examiner*—David L. Pirlot
*Attorney, Agent, or Firm*—William A. Drucker

[57] ABSTRACT

A power connecting terminal for a printed circuit board comprises a clamping screw inserted in a flat fixed part which is folded back on itself and which has three parallel lugs fitting into metallized holes and separated by edges. This part may be fastened to the board by soldering the edges to a conducting layer, and to the lugs by soldering with the metallized holes. The terminal is capable of withstanding high tightening forces.

3 Claims, 6 Drawing Figures

CONNECTING TERMINAL FOR PRINTED CIRCUIT BOARD

This application is a continuation, of application Ser. No. 472,507, filed Mar. 7, 1983, now abandoned.

BACKGROUND OF THE INVENTION

The invention concerns a connecting terminal comprising a thin flat metallic part which has a contact surface fitted with a screw and which is provided with projecting parallel lugs that fit into openings in a printed circuit board so as to be soldered to a conducting layer of this circuit board.

Such terminals, which are frequently used for carrying low currents, are generally arranged side by side by means of an insulating support in order to constitute a connector for operating for example in conjunction with a large number of conductors, the screws generally being arranged to have their center lines perpendicular to or slightly inclined to the plane of the board; in order that the ends of the conductors may be satisfactorily tightened, the screws are usually combined with a massive metallic component with a single opening in which the ends of the conductors and the respective contact surfaces will be pressed together.

Other connecting arrangements with multiple terminals for printed circuit boards, in which the currents to be carried are higher, make use of a large number of flat parts each having two parallel lugs capable of being soldered to a conducting layer placed at the opposite side from the connector, and each comprising a contact surface carried by a tag able to work in conjunction with a flexible clip or socket clamped on one end of the conductor, an insulating holding device being associated with these flat components.

These known methods of making connecting terminals have the disadvantage of being either intended solely for carrying low currents, or of being fragile in the absence of any additional holding means or when the number of flat components is small, and to require costly removable connecting devices.

OBJECT OF THE INVENTION

The invention has for its object a connecting terminal the general arrangement of which is that described above and which is capable of carrying high currents, while being inherently robust, having a low production cost and not needing additional holding devices.

SUMMARY OF THE INVENTION

According to the invention, the metal part of the connecting terminal has two flanges, folded back along a common line perpendicular to the board, so as to form a given angle between them, and has three lugs one of which is close to the fold line, while the two others are distant from it, a threaded hole able to work in conjunction with a terminal screw being arranged in one of the flanges so that its center line is substantially parallel to the plane of the board, the parallel lugs being inserted in metallized openings in the board and soldered to these.

BRIEF DESCRIPTION OF THE DRAWINGS

A better understanding of the invention will be obtained from the following description.

On the attached drawing.

DESCRIPTION OF THE PREFERRED EMBODIMENT

Figure 2:
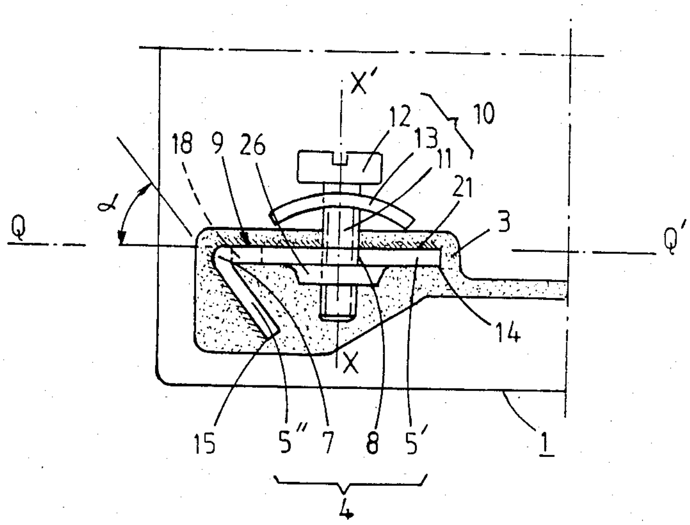
FIG. 2 is a elevation of the terminal, in which the plane PP′ of the printed circuit board which carries it is parallel to the plane of the figure.

A printed circuit board 1, visible in FIG. 2 and comprising an insulated plate 2 and a conduction layer 3, is fitted with a terminal 4 which is placed at the same side as this conducting layer.

Figure 1A:
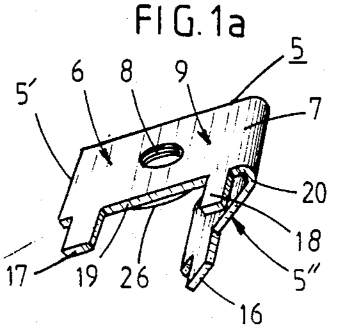
FIG. 1a is a perspective view of a principal part of the terminal, the tightening screw being removed.
Figure 1B:
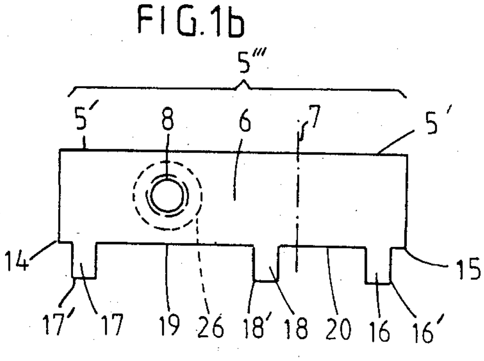
FIG. 1b is a flat view of a cut-out part used for making the principal part.

This terminal consists principally of a metallic part 5 which is visible, in particular, on FIG. 1a and which is obtained by folding along a line 7 a flat cut-out part 5‴, so as to form two flanges 5′ and 5″ forming a given angle $\alpha$ between them, see also FIGS. 1b and 2.

This part 5 has on the flange 5′ a contact or connecting surface 6 which is provided with a threaded hole 8 with center line XX′ perpendicular to the part.

At one side 9 of the flange 5′, which is opposite the flange 5″, is inserted in the hole 8 a clamping device 10 consisting of a screw 11, having a head 12 and a drilled convex-shaped strap 13 which is placed under this head.

Close to the two opposide ends 14, 15 of the two flanges and respectively to the fold line 7, the part 5 has three parallel lugs 16, 17 respectively 18, which are placed in the planes of the two respective flanges.

Figure 3:
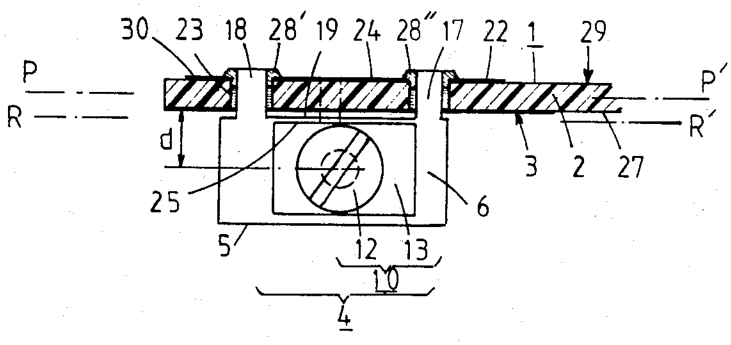
FIG. 3 is a cross-sectional view through the plane QQ′ of FIG. 2, being a top view of the terminal of the printed circuit board.

Two aligned edges 19 and 20 of the part 5 are situated between the lugs 17, 18 respectively 18, 16, before the cut-out part 5‴ is folded and are placed in one and the same plane RR′, visible in FIG. 3, when the part 5 has been folded, the fold line 7 being substantially perpendicular to this plane.

The conducting layer 3 and the insulating plate 2 are perforated by three internally metallized openings 22, 23, 24 the distances between which correspond to those between the lugs 17, 18 and 16 in such a way that the part 5 may be linked to the printed circuit board 1 by inserting these lugs in these openings, see FIG. 3, until the edges 19 and 20 come into immediate proximity of the layer 3.

In order to attach the part 5, a line of solder 21 is laid on the conducting layer so as to wet simultaneously the edges 19 and 20, the lugs 19, 17, 16 and the corresponding metallized holes.

When the part 5 is fixed, the center line XX′ of the screw 10 is substantially parallel to the plane PP′ of the board 1, and is at a distance "d" from the neighbouring face 27 of this board such that an edge 25 of the rectangular strap 13 is guided without rotation when the screw is tightened; the metal strap of convex shape, shown in FIG. 2, may be orientated in such a way that the ends of conductors may be inserted between it and the contact surface 6, either parallel or perpendicular to the plane of the board 1.

A countersunk region 26 bored out concentrically with the hole 8 when the part 5‴ is cut out, provides an adequate number of threads for the screw despite the thinness of this part.

The angle α and the lengths of the flanges will be chosen such that the forces exerted axially and azimuthally on the terminal by a screwdriver will be substantially less than the resisting fastening torques exerted by the terminal and such that the end of the screw does not come up against the flange 5″. Angles lying between 45° and 135° have been found entirely satisfactory.

As a result of the stability and robustness of fastening given to this terminal by soldering three lugs in their openings and soldering the edges against the conducting layer, the high tightening torque which it is necessary to apply to the screw to give an electrical connection capable of carrying high currents leads to neither dangerous deformation of the board nor to a peeling of the conducting layer. An even better attachment is attained when solder beads such as 28′, 28″ connect the ends 16′, 17′, 18′ of the lugs 16, 17, 18 to a second conducting layer 30 deposited on the face 29 opposite the face 27.

When a printed circuit board has one or more terminals in accordance with the description that has just been given and when this board is arranged in a chassis, it is not necessary (as was necessary with former practice in order to avoid mechanical stresses on the board), to effect a very rigorous correspondence between the terminal sockets in the chassis and the terminals themselves; locating the different terminals on the board therefore requires less precision, which reduces the cost of the equipment which uses them.

Figure 4:
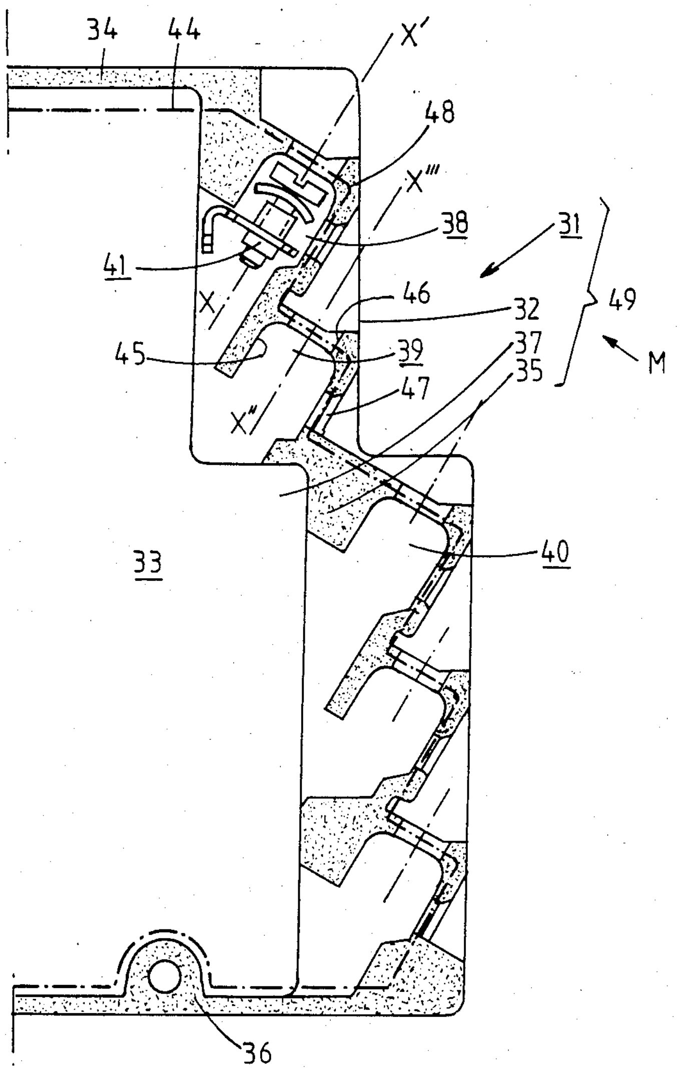
FIG. 4 is an elevation of an example of the use of a board fitted with terminals according to the invention.

In an advantageous arrangement, which is visible in FIG. 4, an electrical apparatus 31 comprises a thin insulating chassis 32 which has a back 37 and a central area 33 surrounded by peripheral walls such as 34, 35, 36.

Figure 5:
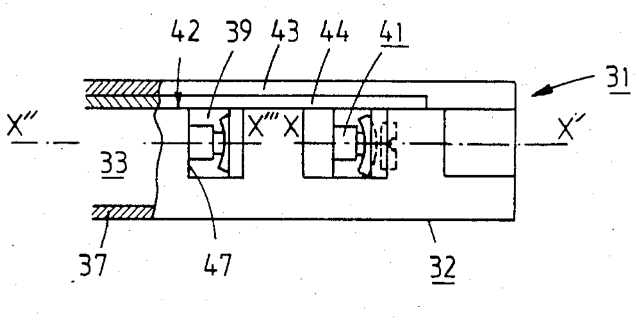
FIG. 5 is a side view in the direction of the arrow M of FIG. 4.

The walls such as 38, 39, 40 . . . , which can accept, with relatively large play, terminals such as 41, fixed on the periphery 48 of a printed circuit board 44 having parallel center lines XX′, X″, X‴. Each socket, such as 39, has a terminal cavity 45, an access opening 46 for a screwdriver and a perpendicular entry 47 for the end of the conductor to be connected. This opening, this cavity and this entry give onto a face 42 of the chassis opposite the back 37 which concerns a particular region 49 of the chassis (see FIG. 5).

A flat insulating lid 43 closes off the space 33 and holds the board to which it is parallel; the interaction between the socket walls and the terminal screws is with advantage designed to make the screws captive.

We claim:

1. In a circuit board assembly which includes a dielectric board having a conducting layer forming electrical circuitry disposed on one side thereof and first, second and third metallized openings bored through the said dielectric board, a terminal for connecting conductors to said electrical circuitry, said terminal comprising, within the contour of a single piece capable of being cut from a sheet of metal blank:

i—a thin flat metal plate with first and second surface portions joining along a folding line with a predetermined angle between said first and second surface portions, said plate having a contact face, an edge surface contained in a plane substantially at right angles to the folding line, and, projecting from said edge surface in the planes of the respective surface portions, first, second and third substantially rigid conductive lugs extending substantially at right angles to the plane of the edge surface, the first and second lugs extending from the first surface portion with the second lug substantially nearer from the folding line than the first lug and the third lug extending from the second surface portion and being located substantially farther from the folding line than the second lug; said first, second and third conductive lugs being respectively inserted in the said first, second and third openings with the said edge surface being soldered to said conductive layer of the dielectric board;

ii—a threaded hole bored through the first surface portion of the metal plate substantially at right angles thereto and a clamping screw screwing into said hole;

iii—said screw having a head and a threaded body and a convex profiled drilled strap mounted about said threaded body, said strap having an inner face which cooperates with said contact face for defining a space adapted to receive said conductors;

iv. the convex-profiled strap is substantially rectangular and has an edge in close proximity to the said edge surface of the first surface portion of the plate.

2. A circuit board assembly according to claim 1, wherein the second surface portion is located on the side of the metal plate opposite the contact face.

3. A circuit board assembly according to claim 1, wherein the said angle lies between 45° and 135°.

* * * * *